United States Patent
Kao et al.

(10) Patent No.: US 12,444,602 B2
(45) Date of Patent: Oct. 14, 2025

(54) SEMICONDUCTOR DEVICE STRUCTURE AND METHODS OF FORMING THE SAME

(71) Applicant: TAIWAN SEMICONDUCTOR MANUFACTURING COMPANY, LTD., Hsinchu (TW)

(72) Inventors: Wan-Yi Kao, Hsinchu (TW); Chunyao Wang, Hsinchu (TW); Yung-Cheng Lu, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 722 days.

(21) Appl. No.: 17/824,129

(22) Filed: May 25, 2022

(65) Prior Publication Data

US 2023/0154746 A1    May 18, 2023

Related U.S. Application Data

(60) Provisional application No. 63/278,805, filed on Nov. 12, 2021.

(51) Int. Cl.
H01L 21/02 (2006.01)
H10D 84/01 (2025.01)
H10D 84/03 (2025.01)

(52) U.S. Cl.
CPC .... H01L 21/0228 (2013.01); H01L 21/02126 (2013.01); H01L 21/02211 (2013.01); H10D 84/0158 (2025.01); H10D 84/038 (2025.01)

(58) Field of Classification Search
CPC .................................................. H01L 21/0228
See application file for complete search history.

(56) References Cited

U.S. PATENT DOCUMENTS

| | | | |
|---|---|---|---|
| 2013/0078392 A1* | 3/2013 | Xiao | H01L 21/0228 546/14 |
| 2019/0103265 A1* | 4/2019 | Kao | H01L 21/0214 |
| 2020/0027719 A1* | 1/2020 | Liao | H01L 21/02211 |
| 2020/0044042 A1 | 2/2020 | Yeh et al. | |
| 2020/0350171 A1 | 11/2020 | Zhou | |
| 2021/0098457 A1 | 4/2021 | Cheng et al. | |

FOREIGN PATENT DOCUMENTS

| | | |
|---|---|---|
| TW | 201913756 | 4/2019 |
| TW | 202002086 | 1/2020 |

* cited by examiner

*Primary Examiner* — William A Harriston
(74) *Attorney, Agent, or Firm* — NZ Carr Law Office

(57) ABSTRACT

A semiconductor device structure and methods of forming the same are described. In some embodiments, the method includes forming a dielectric layer, which includes forming an as deposited layer using an atomic layer deposition process, which includes flowing a silicon source precursor into a process chamber at a first flow rate, flowing a carbon and nitrogen source precursor into the process chamber at a second flow rate, and flowing an oxygen source precursor into the process chamber at a third flow rate. A ratio of the first flow rate to the second flow rate to the third flow rate ranges between about one to one to eight and one to one to twelve, and the as deposited layer has a carbon concentration substantially greater than a nitrogen concentration. The method further includes annealing the as deposited layer in an environment including $H_2O$ to form the dielectric layer.

20 Claims, 13 Drawing Sheets

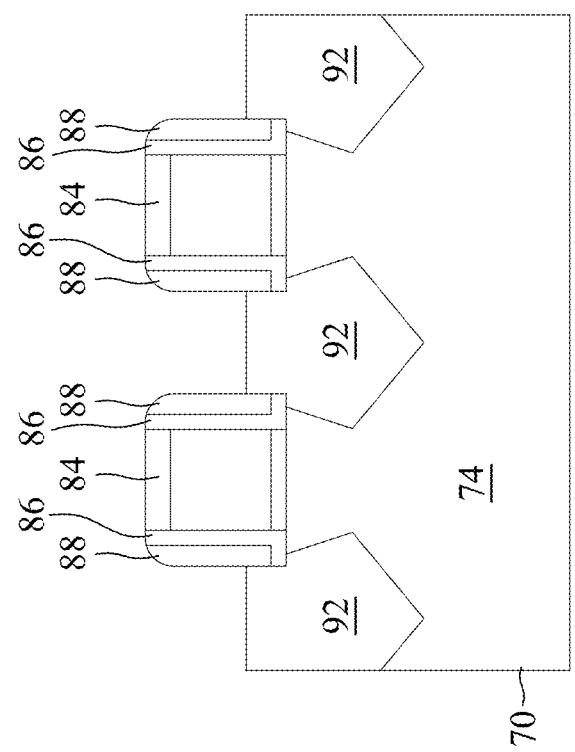
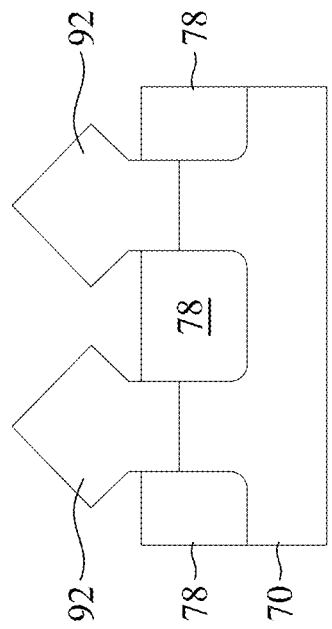
FIG. 5A
FIG. 5B

SEMICONDUCTOR DEVICE STRUCTURE AND METHODS OF FORMING THE SAME

CROSS-REFERENCE TO RELATED APPLICATIONS

This application claims priority to U.S. Provisional Application No. 63/278,805, filed on Nov. 12, 2021, the contents of which are hereby incorporated by reference in their entirety.

BACKGROUND

As the semiconductor industry has progressed into nanometer technology process nodes in pursuit of higher device density, higher performance, and lower costs, challenges from both fabrication and design issues have resulted in the development of three-dimensional designs, such as a Fin Field Effect Transistor (FinFET). FinFET devices typically include semiconductor fins with high aspect ratios and in which channel and source/drain regions are formed. A gate is formed over and along the sides of the fin structure (e.g., wrapping) utilizing the advantage of the increased surface area of the channel to produce faster, more reliable, and better-controlled semiconductor transistor devices. However, with the decreasing in scaling, new challenges are presented.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1A-C, 2A-B, 3A-B, 4A-B, 5A-B, and 6A-B are various views of respective intermediate structures at intermediate stages in an example process of forming a semiconductor device structure in accordance with some embodiments.

DETAILED DESCRIPTION

Figure 1B:
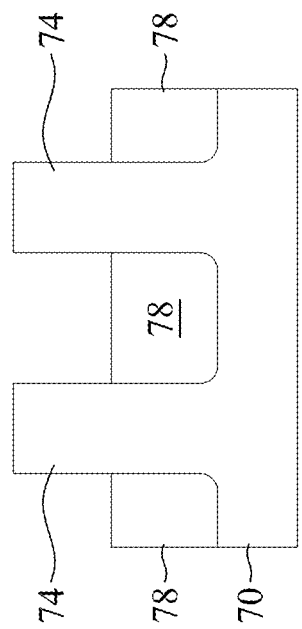

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "on," "top," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 6B:
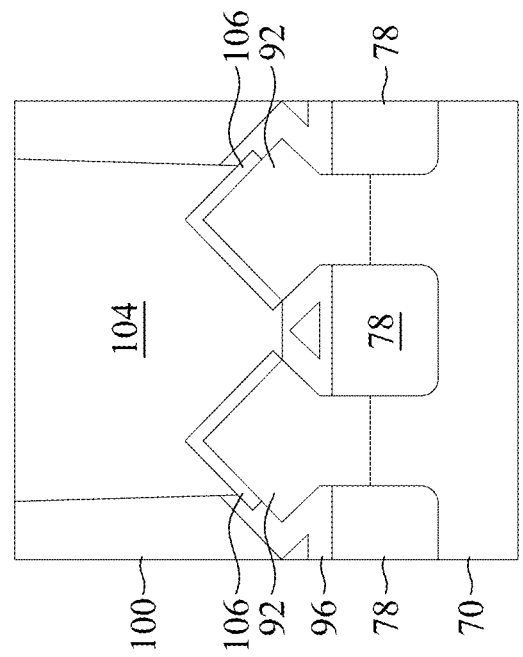
Figure 6A:
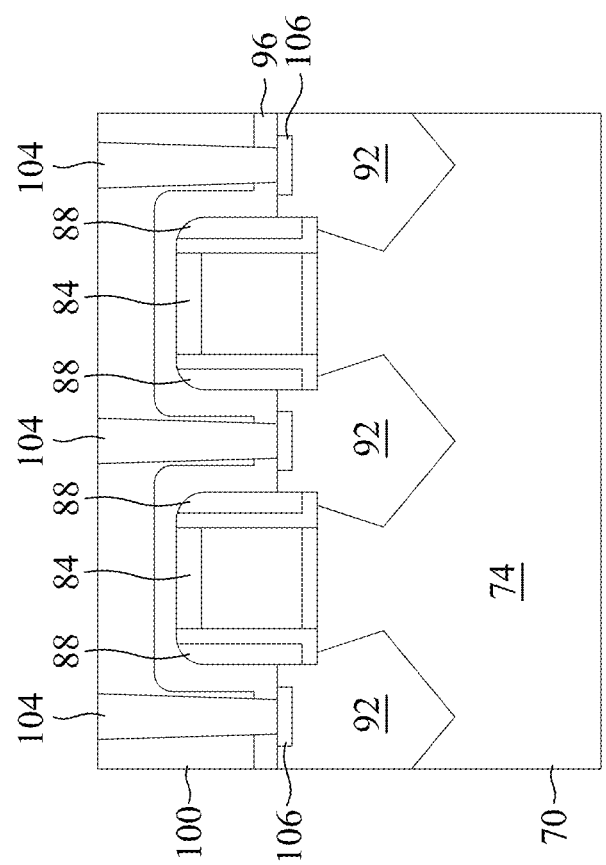

FIGS. 1A-C through 8A-B are views of respective intermediate structures at various stages in example processes of forming semiconductor device structure in accordance with some embodiments. Aspects of FIGS. 1A-C through 5A-B are applicable to a gate-first process and a replacement gate process described herein. FIGS. 6A-B illustrate further aspects of a gate-first process described here. FIGS. 7A-B and 8A-B illustrate further aspects of a replacement gate process as described herein.

Figure 1A:
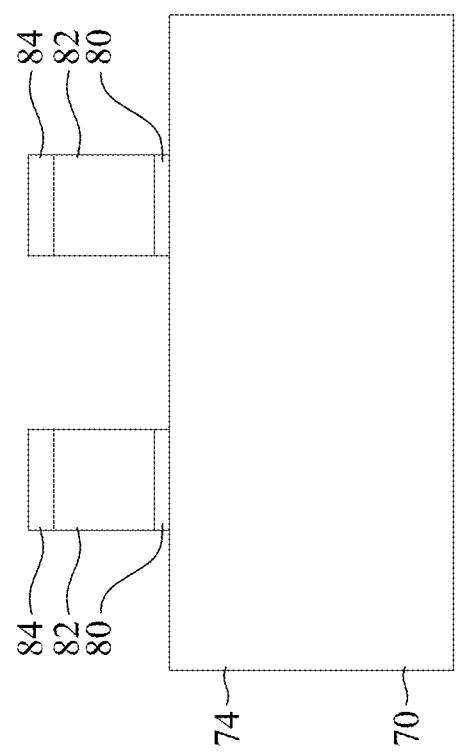
Figure 1C:
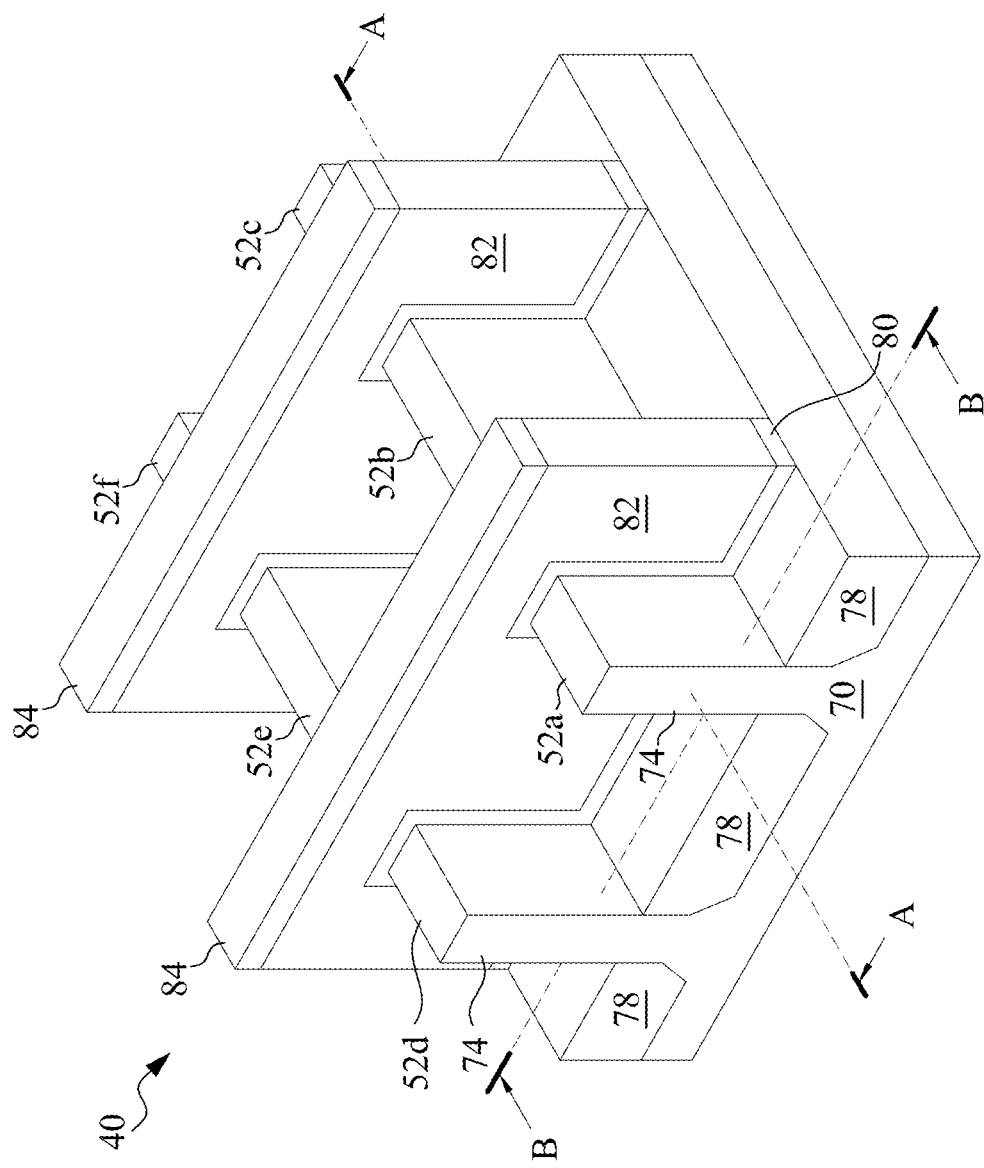

FIGS. 1A, 1B, and 1C illustrate different views of an intermediate structure at a stage in an example process of forming a semiconductor device structure in accordance with some embodiments. FIGS. 1A and 1B are different cross-sectional views of the intermediate structure, and FIG. 1C is a perspective view of the intermediate structure.

As shown in FIGS. 1A-1C, fins 74 are formed from a semiconductor substrate 70. Isolation regions 78 are disposed on the semiconductor substrate 70 and are disposed between neighboring fins 74. The fins 74 each protrude above and from between neighboring isolation regions 78. Gate stacks (or more generically, gate structures), with each including a dielectric layer 80, a gate layer 82, and a mask 84, are formed along sidewalls and over top surfaces of the fins 74. Source/drain regions 52a-f are located in respective regions of the fins 74.

FIG. 1C further illustrates reference cross-sections that are used in other figures. Cross-section A-A is in a plane along the fin 74. Cross-section B-B is in a plane perpendicular to the cross-section A-A and is across source/drain regions 52a and 52d of neighboring fins 74. Figures refer to these reference cross-sections for clarity. Figures ending with an "A" designation illustrate cross-sectional views at various instances of processing corresponding to cross-section A-A, and figures ending with a "B" designation illustrate cross-sectional views at various instances of processing corresponding to cross-section B-B.

The semiconductor substrate 70 may be or include a bulk semiconductor substrate, a semiconductor-on-insulator (SOI) substrate, or the like, which may be doped (e.g., with a p-type or an n-type dopant) or undoped. In some embodiments, the semiconductor material of the semiconductor substrate may include an elemental semiconductor including silicon (Si) or germanium (Ge); a compound semiconductor; an alloy semiconductor; or a combination thereof.

The fins 74 may be formed from the semiconductor substrate 70, such as by etching trenches between the fins 74. The isolation regions 78 may be formed in trenches between the fins 74. The isolation regions 78 may include or be an insulating material such as an oxide (such as silicon oxide), a nitride, the like, or a combination thereof. The fins 74 protrude from between neighboring isolation regions 78, which may, at least in part, thereby delineate the fins 74 as active areas on the semiconductor substrate 70. The fins 74 and isolation regions 78 may be formed by any acceptable processes and can include any acceptable material. In some examples, the fins 74 may include heteroepitaxial structures (e.g., a material lattice-mismatched to the semiconductor material of the semiconductor substrate 70) or other structures.

The gate stacks are formed over and extend laterally perpendicularly to the fins 74. Each gate stack includes a dielectric layer 80, a gate layer 82, and a mask 84. The gate stacks can be operational gate stacks in a gate-first process or can be dummy gate stacks in a replacement gate process.

In a gate-first process, the dielectric layer 80 may be a gate dielectric, and the gate layer 82 may be a gate electrode. The gate dielectrics may include or be silicon oxide, silicon nitride, a high-k dielectric material, the like, or multilayers thereof. A high-k dielectric material can have a k value greater than about 7.0 and may include a metal oxide or silicate of Hf, Al, Zr, La, Mg, Ba, Ti, Pb, multilayers thereof, or a combination thereof. The gate electrodes may include or be silicon (e.g., polysilicon, which may be doped or undoped), a metal-containing material (such as titanium, tungsten, aluminum, ruthenium, or the like), or a combination thereof (such as a silicide or multiple layers thereof). The masks 84 may include or be silicon nitride, silicon oxynitride, silicon carbon nitride, the like, or a combination thereof. The layers for the masks 84, gate electrodes, and gate dielectrics may be deposited and patterned into the gate stacks using any acceptable processes to form the mask 84, gate layer 82, and dielectric layer 80 for each gate stack.

In a replacement gate process, the dielectric layer 80 may be an interfacial dielectric, and the gate layer 82 may be a dummy gate. The interfacial dielectrics may include or be silicon oxide, silicon nitride, the like, or multilayers thereof. The dummy gates may include or be silicon (e.g., polysilicon) or another material. The masks 84 may include or be silicon nitride, silicon oxynitride, silicon carbon nitride, the like, or a combination thereof. The layers for the masks 84, dummy gates, and interfacial dielectrics may be deposited and patterned into the gate stacks using any acceptable processes to form the mask 84, gate layer 82, and dielectric layer 80 for each gate stack.

Figure 2B:
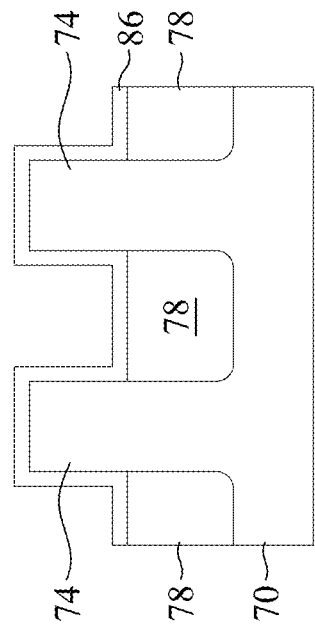
Figure 2A:
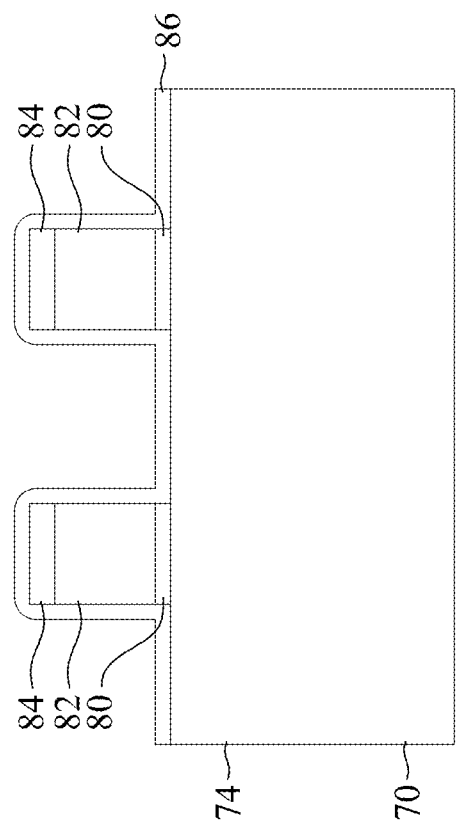

FIGS. 2A and 2B illustrate the formation of a first gate spacer layer 86 along sidewalls and top surfaces of the gate stacks and the fins 74. The first gate spacer layer 86 is conformally deposited along sidewalls and top surfaces of the fins 74 and gate stacks (e.g., along sidewalls of dielectric layers 80, gate layers 82, and masks 84, and on top surfaces of masks 84), and on top surfaces of the isolation regions 78. The first gate spacer layer 86 can be or include silicon oxycarbonitride (SiOCN), silicon oxycarbide (SiOC), or another material. The first gate spacer layer 86 may have a k value in a range from about 5.0 to about 7.0. In some examples, the first gate spacer layer 86 can be deposited using an atomic layer deposition (ALD) process, although other deposition techniques can be used. In some embodiments, the first gate spacer layer 86 may be omitted.

Figure 3A:
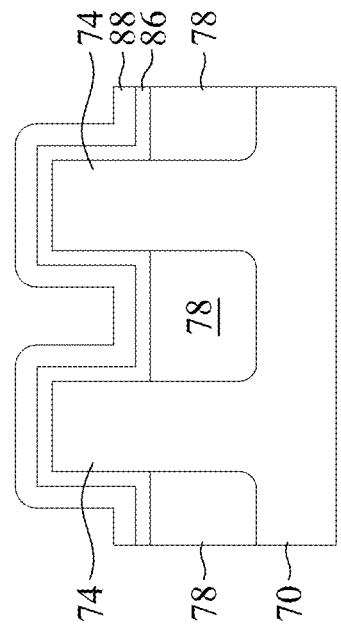
Figure 3B:
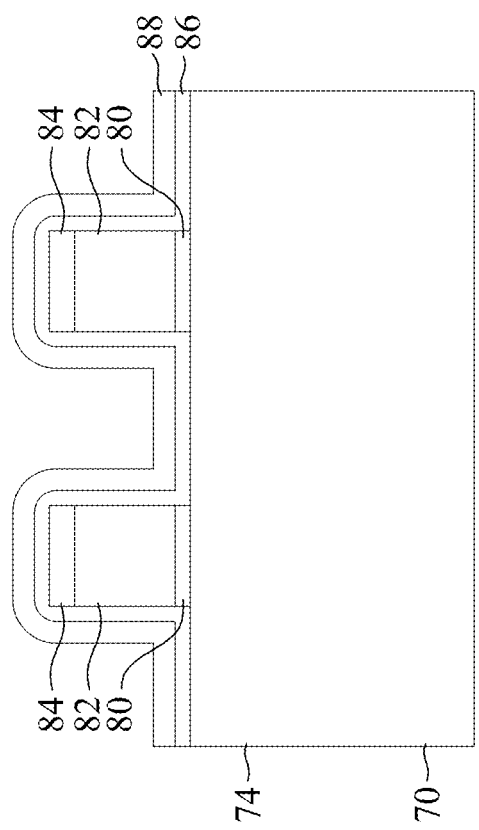

FIGS. 3A and 3B illustrate the formation of a second gate spacer layer 88. The second gate spacer layer 88 is conformally deposited on the first gate spacer layer 86. The second gate spacer layer 88 is a dielectric layer including silicon, oxygen, nitrogen and carbon. In some embodiments, the second gate spacer layer 88 can be or include a silicon oxycarbonitride (SiOCN). In some embodiments, the second gate spacer layer 88 has a carbon concentration in a range from about 1 atomic percent (at. %) to about 10 at. %, such from about 5 at. %. to about 10 at. %, for example 6 at. %. In some embodiments, the second gate spacer layer 88 has a nitrogen concentration in a range from about 1 at. % to about 5 at. %, such as from about 1 at. % to about 4 at. %, for example 2 at. %. In some embodiments, the second gate spacer layer 88 has an oxygen concentration in a range from about 55 at. % to about 70 at. %, such as about 60 at. %. In some embodiments, the second gate spacer layer 88 has a silicon concentration in a range from about 25 at. % to about 35 at. %, such as about 32 at. %. In some embodiments, the ratio of the carbon concentration to the nitrogen concentration ranges from about 2 to 1 to about 10 to 1, such as about 3 to 1 to about 6 to 1. With the carbon concentration being greater than the nitrogen concentration, the k value of the second gate spacer layer 88 is less than 4.1, such as about 3.8 to 4.0, which is lower than a SiOCN layer having a carbon concentration less than a nitrogen concentration.

The second gate spacer layer 88 may be a high-density dielectric layer. The second gate spacer layer 88 may have a density equal to or greater than about 2.0 g/cm$^3$. For example, the second gate spacer layer 88 may have a density in a range from about 2.0 g/cm$^3$ to about 2.8 g/cm$^3$, such as about 2.2 g/cm$^3$. With the second gate spacer layer 88 having high-density and low k value, plasma resistance in certain etch processes and capacitance efficiency in the device are improved.

The second gate spacer layer 88 can be formed by sequentially pulsing a silicon source precursor, a nitrogen and carbon source precursor, and an oxygen source precursor in an ALD process followed by an anneal process to reduce a nitrogen concentration. Additional details of examples of the second gate spacer layer 88 and ALD and anneal processes for forming those examples of the second gate spacer layer 88 are described below with respect to FIGS. 10 and 11.

Figure 4B:
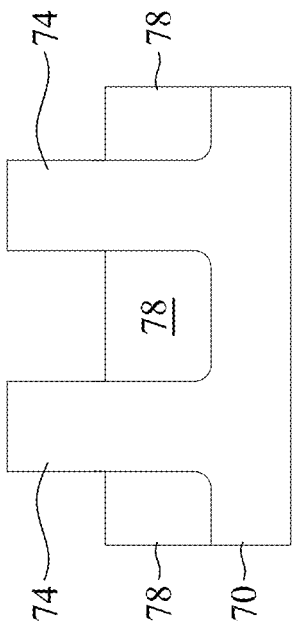
Figure 4A:
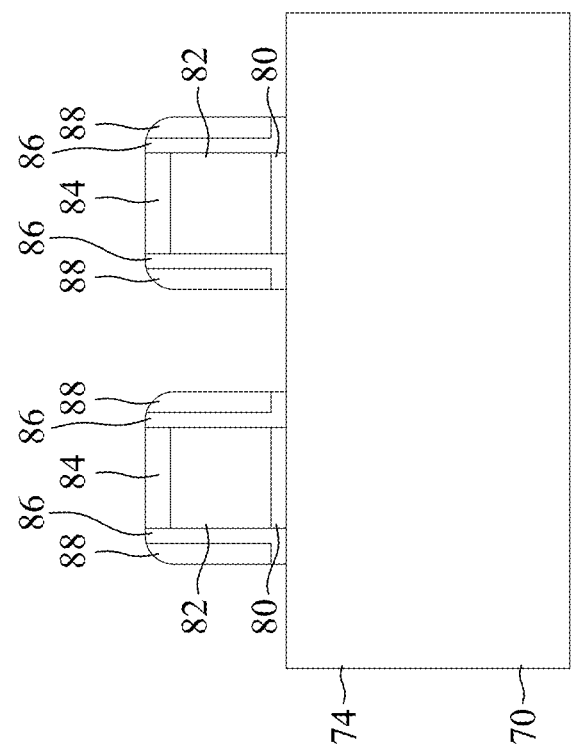

FIGS. 4A and 4B illustrate the formation of gate spacers including respective portions of the first gate spacer layer 86 and the second gate spacer layer 88. Gate spacers (e.g., bi-layer gate spacers, as illustrated) are formed along sidewalls of the gate stacks (e.g., sidewalls of the dielectric layer 80, gate layer 82, and mask 84) and over the fins 74. Residual gate spacers may also remain along sidewalls of the fins 74, for example, depending on the height of the fins 74 above the isolation regions 78. The gate spacers may be formed by anisotropically etching the second gate spacer layer 88 and the first gate spacer layer 86. The etch process can include a RIE, NBE, or another etch process. The multi-layer gate spacers may include additional and/or different layers and/or materials in other embodiments.

FIGS. 5A and 5B illustrate the formation of source/drain regions 92. Recesses are formed in the fins 74 on opposing sides of the gate stacks, and the source/drain regions 92 are formed in the recesses. The recessing can be by an etch process. The etch process can be isotropic or anisotropic, or further, may be selective with respect to one or more crystalline planes of the semiconductor substrate 70. Hence, the recesses can have various cross-sectional profiles based on the etch process implemented. While forming the recess, the second gate spacer layer 88 can be exposed to the etch chemistry. The second gate spacer layer 88, as described herein, can have improved resistance against the etching chemistry while maintaining a lower k value for target capacitance efficiency.

As shown in FIGS. 5A and 5B, epitaxy source/drain regions 92 may be formed in the recesses. The epitaxy source/drain regions 92 may include or be silicon germanium, silicon carbide, silicon phosphorus, a III-V compound semiconductor, a II-VI compound semiconductor, or the like. The epitaxy source/drain regions 92 may be formed in the recesses by epitaxially growing a material in the recesses, such as by metal-organic CVD (MOCVD), molecular beam epitaxy (MBE), liquid phase epitaxy (LPE), vapor phase epitaxy (VPE), selective epitaxial growth (SEG), the like, or a combination thereof. The epitaxy source/drain regions 92 may extend beyond sidewalls and top surfaces of the fins 74 (e.g., are raised) and may have facets, which may correspond to crystalline planes of the semiconductor substrate 70. In some examples, different materials are used for epitaxy source/drain regions 92 for p-type devices and n-type devices. Appropriate masking during the recessing or epitaxial growth may permit different materials to be used in different devices.

A person having ordinary skill in the art will also readily understand that the recessing and epitaxial growth of source/drain regions 92 may be omitted, and that source/drain regions may be formed by implanting dopants into the fins 74 using the gate stacks and gate spacers as masks. In some examples where epitaxy source/drain regions 92 are implemented, the epitaxy source/drain regions 92 may also be doped, such as by in-situ doping during epitaxial growth and/or by implanting dopants into the epitaxy source/drain regions 92 after epitaxial growth. Hence, a source/drain region may be delineated by doping (e.g., by implantation and/or in situ during epitaxial growth, if appropriate) and/or by epitaxial growth, if appropriate, which may further delineate the active area in which the source/drain region is delineated. Because of the high density of the second gate spacer layer 88, the second gate spacer layer 88 may be able to withstand the implantation process with less damage from the bombardment of particles compared to some other gate spacer materials.

FIGS. 6A and 6B, in continuation of a gate-first process, illustrate the formation of dielectric layers over the fins 74, epitaxy source/drain regions 92, and gate stacks, and the formation of conductive features 104 through the dielectric layers to the epitaxy source/drain regions 92. After the formation of the source/drain regions 92, a contact etch stop layer (CESL) 96 is conformally deposited by any acceptable process, on surfaces of the epitaxy source/drain regions 92, sidewalls and top surfaces of the multi-layer gate spacers, top surfaces of the mask 84, and top surfaces of the isolation regions 78. Generally, an etch stop layer can provide a mechanism to stop an etch process when forming, e.g., contacts or vias. An etch stop layer may be formed of a dielectric material having a different etch selectivity from adjacent layers or components. The CESL 96 may include silicon nitride, silicon carbon nitride, the like, or a combination thereof.

A first interlayer dielectric (ILD) 100 may be formed over the CESL 96. The first ILD 100 may include or be silicon dioxide, a low-k dielectric material, such as silicon oxynitride, phosphosilicate glass (PSG), borosilicate glass (BSG), borophosphosilicate glass (BPSG), undoped silicate glass (USG), fluorinated silicate glass (FSG), organosilicate glasses (OSG), $SiO_xC_y$, spin-on-glass, spin-on-polymers, silicon carbide material, a compound thereof, a composite thereof, the like, or a combination thereof. The first ILD 100 may be deposited by any acceptable process. In a gate-first process as shown in FIGS. 6A and 6B, a top surface of the first ILD 100 may be above the upper portions of the CESL 96 and the gate stacks. Hence, the upper portions of the CESL 96 may remain over the gate stacks.

Conductive features 104 are then formed in openings through the first ILD 100 and CESL 96 to connect with the epitaxy source/drain regions 92. The conductive features 104 may include an adhesion and/or barrier layer and conductive material on the adhesion and/or barrier layer, for example. In some examples, the conductive features 104 may include silicide regions 106 on the epitaxy source/drain regions 92, as illustrated. The adhesion and/or barrier layer can be conformally deposited in the openings and over the first ILD 100. The adhesion and/or barrier layer may be or include titanium, titanium nitride, titanium oxide, tantalum, tantalum nitride, tantalum oxide, the like, or a combination thereof. The silicide regions 106 may be formed on upper portions of the epitaxy source/drain regions 92 by reacting upper portions of the epitaxy source/drain regions 92 with the adhesion and/or barrier layer. An anneal process can be performed to facilitate the reaction of the epitaxy source/drain regions 92 with the adhesion and/or barrier layer. The conductive material can be deposited on the adhesion and/or barrier layer and fill the openings. The conductive material may be or comprise tungsten, copper, aluminum, gold, silver, alloys thereof, the like, or a combination thereof. The conductive features 104 may be or may be referred to as contacts, plugs, etc.

FIGS. 7A-B and 8A-B illustrate further aspects of a replacement gate process as described herein. Processing is first performed as described above with respect FIGS. 1A-C through 5A-B and then proceeds to FIGS. 7A-B.

Figure 7B:
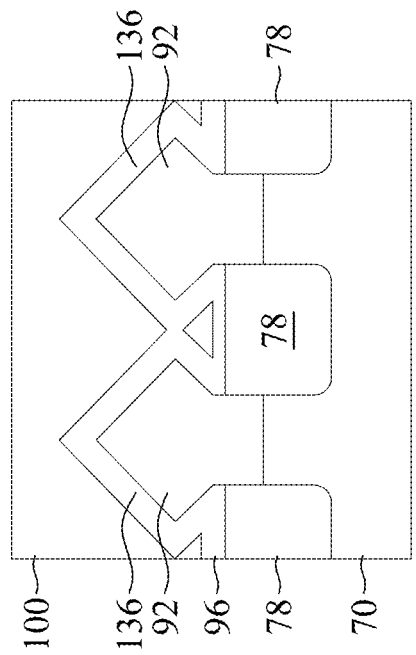
FIGS. 7A-B and 8A-B are cross-sectional views of respective intermediate structures at intermediate stages in another example process of forming a semiconductor device structure in accordance with some embodiments.
Figure 7A:
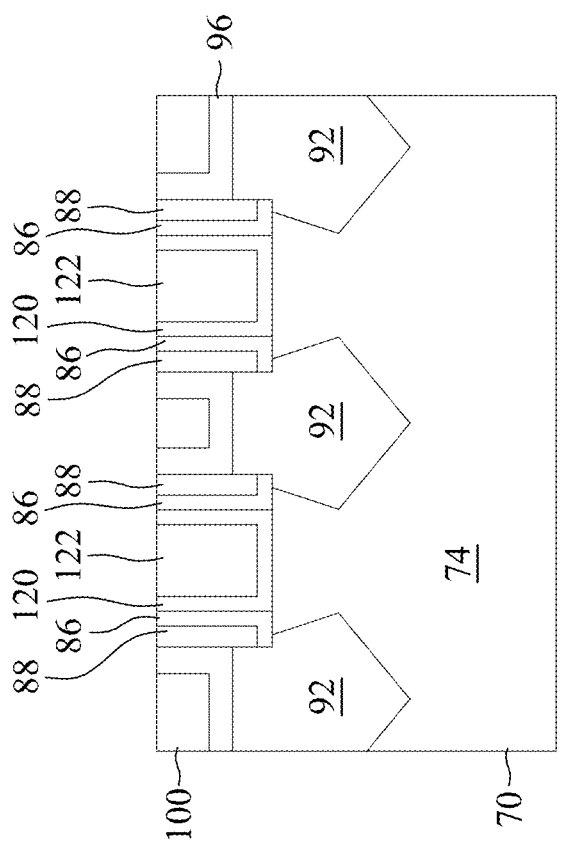

FIGS. 7A and 7B illustrate the replacement of gate stacks with replacement gate structures after formation of the epitaxial source/drain region in FIGS. 5A-B. The CESL 96 and first ILD 100 may be formed as described in FIGS. 6A-B. The first ILD 100 and CESL 96 are formed with top surfaces coplanar with top surfaces of the gate layers 82. A planarization process, such as a CMP, may be performed to level the top surface of the first ILD 100 and CESL 96 with the top surfaces of the gate layers 82. The CMP may also remove the mask 84 (and, in some instances, upper portions of the multi-layer gate spacers) on the gate layers 82. Accordingly, top surfaces of the gate layers 82 are exposed through the first ILD 100 and the CESL 96.

With the gate layers 82 exposed through the first ILD 100 and the CESL 96, the gate layers 82 and the dielectric layers 80 are removed, such as by one or more etch processes. The gate layers 82 may be removed by an etch process selective to the gate layers 82, wherein the dielectric layers 80 act as etch stop layers, and subsequently, the dielectric layers 80 can be removed by a different etch process selective to the dielectric layers 80. The etch processes can be, for example, a RIE, NBE, a wet etch, or another etch process. Recesses are formed between multi-layer gate spacers where the gate stacks are removed, and channel regions of the fins 74 are exposed through the recesses.

During removal of the gate layers 82 and the dielectric layers 80, the top of the second gate spacer layer 88 is exposed to the etch chemistry. The second gate spacer layer 88 can have improved density to withstand the etching chemistry reducing spacer loss during etch and improve capacitance efficiency in the device.

After the gate layers 82 and the dielectric layers 80 are removed, the replacement gate structures are formed in the recesses where the gate stacks were removed. The replacement gate structures each include one or more conformal layers 120 and a gate electrode 122. The one or more conformal layers 120 include a gate dielectric layer and may include one or more work-function tuning layers. The gate dielectric layer can be conformally deposited in the recesses where gate stacks were removed. The gate dielectric layer can be or include silicon oxide, silicon nitride, a high-k dielectric material, multilayers thereof, or other dielectric material. Then, if implemented, a work-function tuning layer may be conformally deposited on the gate dielectric layer. The work-function tuning layer may include or be tantalum, tantalum nitride, titanium, titanium nitride, the like, or a combination thereof. Any additional work-function tuning layers may be sequentially deposited similar to the first work-function tuning layer. Gate electrodes 122 are formed over the one or more conformal layers 120. The layer for the gate electrodes 122 can fill remaining recesses where the gate stacks were removed. The gate electrodes 122 may be or include a metal-containing material such as Co, Ru, Al, W, Cu. multi-layers thereof, or a combination thereof.

Figure 8B:
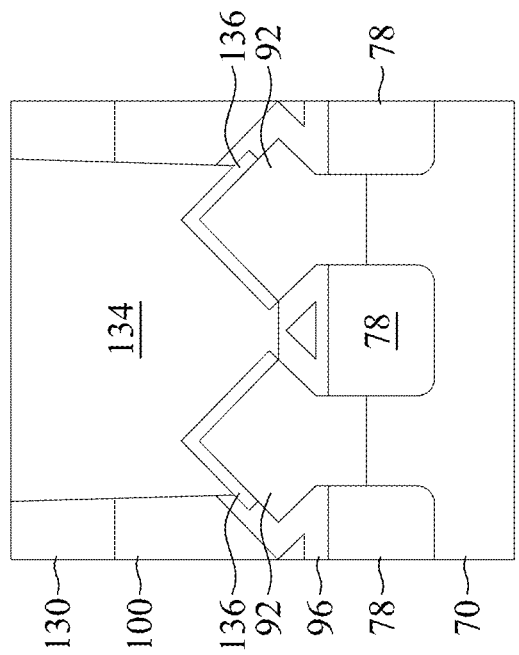
Figure 8A:
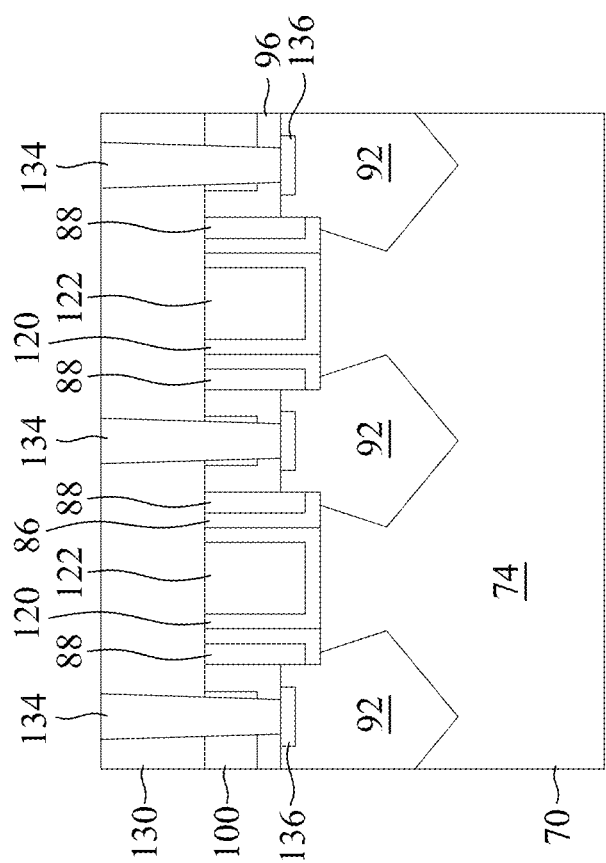

FIGS. 8A and 8B illustrate the formation of a second ILD 130 over the replacement gate structures and the first ILD 100, and the formation of conductive features 134 through the second ILD 130, the first ILD 100, and the CESL 96 to the epitaxy source/drain regions 92. The second ILD 130 is formed over the first ILD 100, replacement gate structures, gate spacer layers, and CESL 96. Although not illustrated, in some examples, an etch stop layer (ESL) may be deposited over the first ILD 100, etc., and the second ILD 130 may be deposited over the ESL. If implemented, the ESL may include or be silicon nitride, silicon carbon nitride, silicon carbon oxide, carbon nitride, the like, or a combination thereof. The second ILD 130 may include or be silicon dioxide, a low-k dielectric material, such as silicon oxynitride, PSG, BSG, BPSG, USG, FSG, OSG, $SiO_xC_y$, spin-on-glass, spin-on-polymers, silicon carbon material, a compound thereof, a composite thereof, the like, or a combination thereof. The conductive features 134 may be formed through the second ILD 130, first ILD 100, and CESL 96 to the epitaxy source/drain regions 92, and with silicide regions 136, similarly as described above with respect to the conductive features 104 of FIGS. 6A-B.

Figure 9:
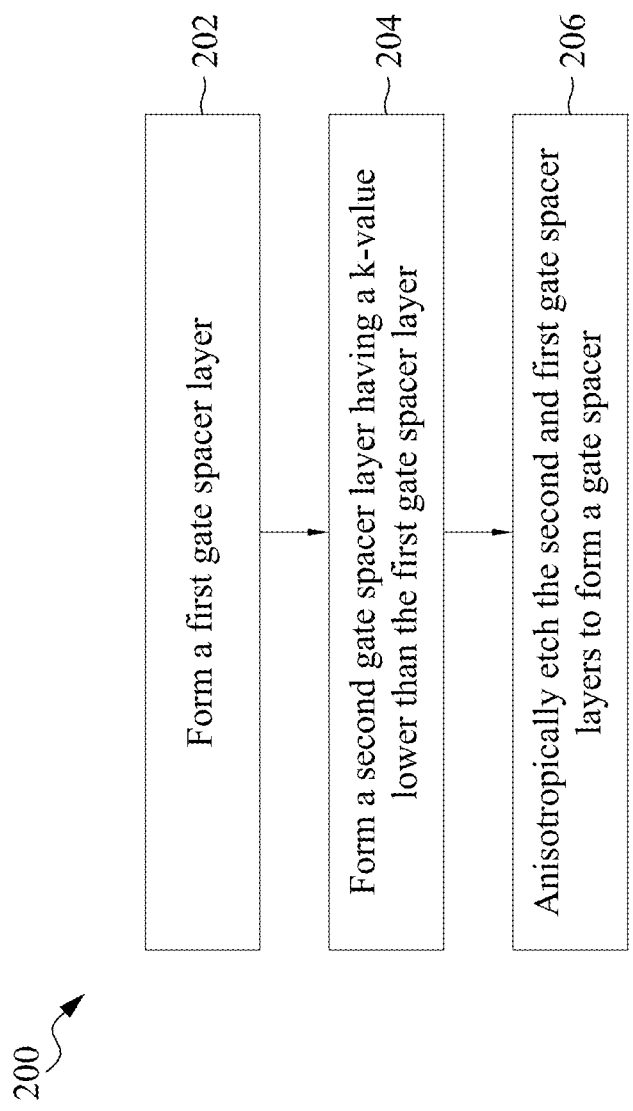
FIG. 9 is a process flow for forming a gate spacer in accordance with some embodiments.

FIG. 9 is a process flow 200 for forming a gate spacer in accordance with some embodiments. In operation 202, optionally, a first gate spacer layer is formed on a device structure, such as generally illustrated in and described with respect to FIGS. 2A and 2B. The first gate spacer layer may be formed by an ALD process. The first gate spacer layer may be a SiOCN layer, a SiOC layer, a SiN layer, a SiON layer, or the like. The first gate spacer layer may have a higher k value than a subsequent gate spacer layer. This operation 202 may be omitted.

Figure 10:
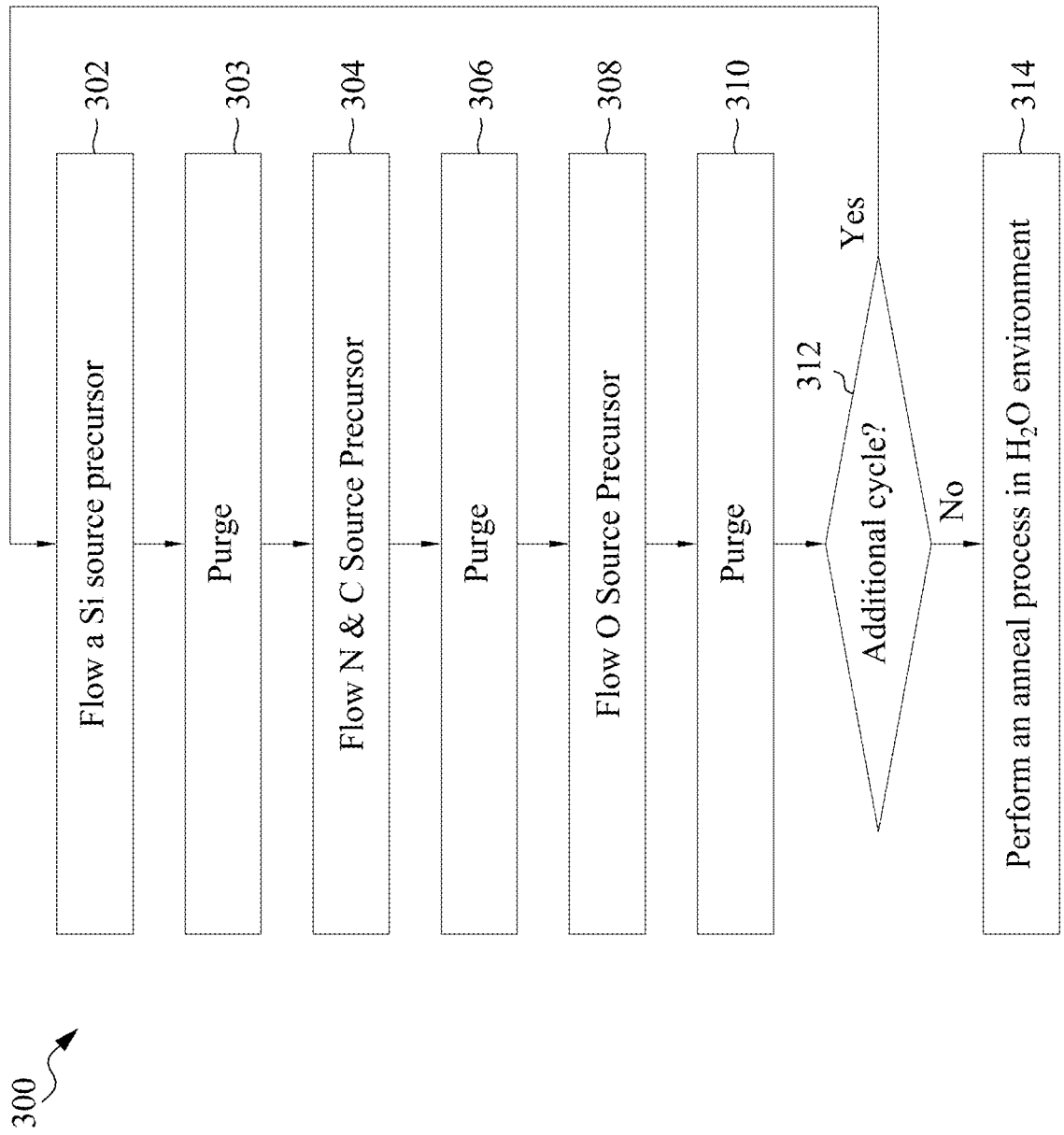
FIG. 10 is process flow for forming and treating a dielectric layer in accordance with some embodiments.

In operation 204, a second gate spacer layer, such as the second gate spacer layer 88 (FIGS. 3A and 3B), is formed using an ALD process and an anneal process to achieve a target film density and a target k value. The second gate spacer layer is formed on the first gate spacer layer, if optionally implemented, or on the device structure. Generally, the formation of the second gate spacer layer is illustrated in and described with respect to FIGS. 3A and 3B. The second gate spacer layer may be a SiOCN layer having a high ratio of carbon concentration to nitrogen concentration, such as 2 to 1 to about 10 to 1. The second gate spacer layer has a low k value as a result of the high ratio of carbon concentration to nitrogen concentration. In some embodiments, operation 204 includes forming a dielectric layer using an ALD process and annealing the dielectric layer after the ALD process. FIG. 10 describes a process can be used in operation 204 according to some embodiments of the present disclosure.

In operation 206, the second gate spacer layer and the first gate spacer layer, if implemented, are anisotropically etched to form the gate spacer, such as generally illustrated in and described with respect to FIGS. 4A and 4B.

FIG. 10 is a process flow 300 for forming a dielectric layer, such as the second gate spacer layer 88, in accordance with some embodiments. The process flow 300 may be used to form the second gate spacer layer in operation 204.

The process flow 300, in this example, includes an ALD process and an anneal process. The layer formed by the process flow 300 can be or include silicon oxycarbonitride (SiOCN) or another material. The layer in process flow 300 may be formed by the ALD process including sequentially flowing a silicon source precursor, a nitrogen and carbon source precursor, and an oxygen source precursor in multiple cycles. The anneal process is performed after the ALD process to achieve a target k value and material properties. The reactions among the precursors combined with the anneal process can enable a dielectric film that has a lower k value, such as lower than 4.1, for example from about 3.8 to about 4, strong plasma and etch chemistry resistivity, and high density against physical bombardment in subsequent processes. When used in a gate spacer layer, the layer can provide a film with a lower k value for capacitance efficiency and a strong film against damages in the subsequent processes, resulting in a transistor with improved performance.

Operations 302 through 310 illustrate a cycle of the ALD process. The cycle includes alternating flow (or pulse) and purge operations, where each precursor is flowed (or pulsed) and subsequently purged at least once during the cycle. In some embodiments, the ALD process may be performed in an ALD chamber at a temperature range from about 400 degrees Celsius to about 800 degrees Celsius, for example from about 620 degrees Celsius to about 640 degrees Celsius. FIGS. 11A through 11H schematically illustrate reactions during the ALD process according to some embodiments.

In operation 302, the silicon source precursor is flowed in an ALD chamber. The silicon source precursor is flowed in the ALD chamber having a substrate to be processed, for example, a substrate having device structure shown in FIGS. 2A-B formed thereon. The silicon source precursor reacts with the terminal groups on the substrate surface forming a monolayer of intermediate products. In some embodiments, the silicon source precursor may be hexachlorodisilane (HCD, $Si_2Cl_6$) or others.

Figure 11A:
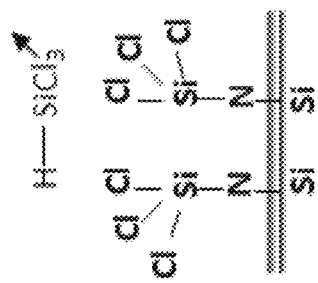
FIGS. 11A through 11F are schematic illustrations of reactions during formation and treatment of the dielectric layer formed in FIG. 10 in accordance with some embodiments.
Figure 11B:
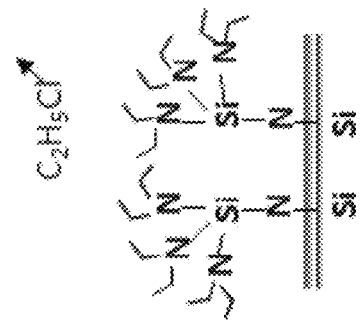

FIG. 11A schematically illustrates bonds on the substrate surface of the device structure shown in FIGS. 2A-B, which has a surface of a dielectric material, for example, the first gate spacer layer 86. As shown in FIG. 11A, in some embodiments, the surface has terminal groups of nitrogen atoms (or (—NH) groups) connected to silicon. FIG. 11B schematically illustrates reactions on the surface in operation 302 when HCD is flowed in the ALD chamber. For example, the HCD at the processing temperature in the ALD chamber may react with the terminal groups of the surface to attach silicon and chlorine atoms to the nitrogen atoms on the surface thereby forming N—Si—Cl bonds on the substrate surface, while hydrogen bonded with $SiCl_3$ is produced as a byproduct. In some embodiments, an HCD precursor reacts with the substrate surface forming a first intermediate film of a monolayer of molecules on the substrate surface. In some embodiments, the HCD precursor is flowed into the ALD chamber at a flow rate ranging from about 0.2 standard liter per minute (slm) to about 0.8 slm, such as about 0.5 slm. The HCD precursor may be flowed into the ALD chamber for a duration ranging from about 15 seconds to about 25 seconds, such as about 20 seconds.

In operation 303, the ALD chamber is purged to remove by-products and unconsumed silicon source precursor in operation 302 from the ALD chamber.

Figure 11C:
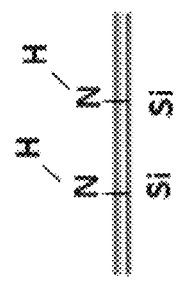
Figure 11D:
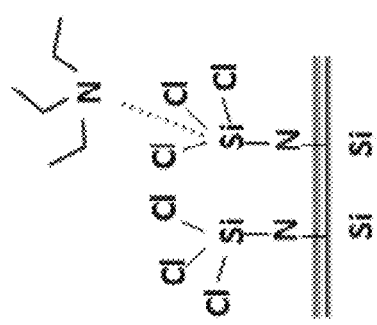

In operation 304, a nitrogen and carbon source precursor is flowed into the ALD chamber. In some embodiments, the nitrogen and carbon source precursor may include triethylamine ($N(C_2H_5)_3$, also known as RENA) or others. FIG. 11C schematically illustrates RENA molecules approaching the substrate surface with Si—Cl bonds. RENA may decompose in the ALD chamber and react with the intermediate film on the substrate surface. For example, a bond to nitrogen (N) in the decomposed RENA may break off to allow the decomposed RENA to replace Cl in the Si—Cl bonds on the substrate surface to form a second intermediate film. The chlorine atom breaking away from the Si—Cl bond may react with $C_2H_5$ in the decomposed RENA to form $C_2H_5Cl$ as a by-product. FIG. 11D schematically illustrates decomposed RENA replacing Cl atoms on the surface of the substrate. In some embodiments, RENA may react with surface layers to form the second intermediate film of a monolayer of molecules on the substrate surface. In some embodiments, the RENA precursor is flowed into the ALD chamber at a flow rate ranging from about 0.2 slm to about 0.8 slm, such as about 0.5 slm. The RENA precursor may be flowed into the ALD chamber for a duration ranging from about 15 seconds to about 25 seconds, such as about 20 seconds.

In operation 306, the ALD chamber is purged to remove by-products and unconsumed nitrogen and carbon source precursor in operation 304 from the ALD chamber.

In operation 308, an oxygen source precursor is flowed to the ALD chamber. In some embodiments, the oxygen source precursor may include oxygen gas ($O_2$), as shown in FIG. 11E. In some embodiments, the oxygen precursor is flowed into the ALD chamber at a flow rate ranging from about 2 slm to about 8 slm, such as about 5 slm. The oxygen precursor may be flowed into the ALD chamber for a duration ranging from about 20 seconds to about 30 seconds, such as about 25 seconds. Decomposed RENA on the second intermediate film may further thermally decompose in the $O_2$ environment resulting in Si—O bonds and releasing $NH(C_2H_5)$ and aldehyde groups. An example reaction may be:

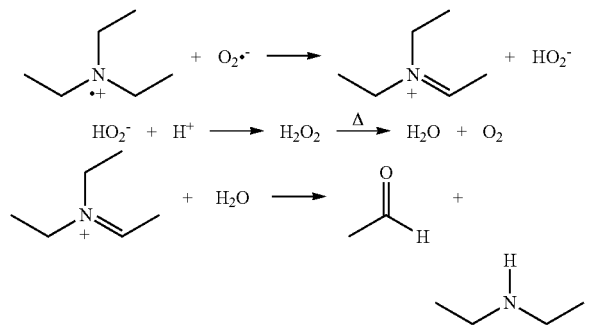

Figure 11F:
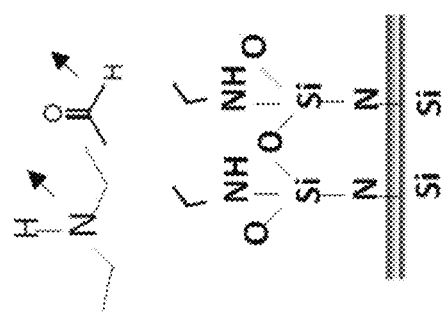
Figure 11E:
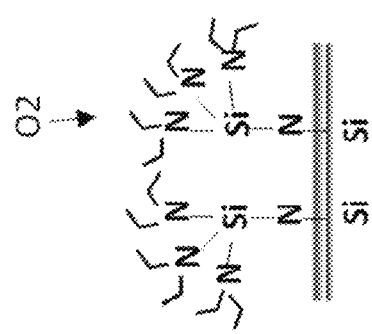

The resulting SiOCN layer formed on the surface of the substrate is shown in FIG. 11F.

In operation 310, the ALD chamber is purged to remove by-products and unconsumed oxygen source precursor in operation 308 from the ALD chamber.

One cycle of the ALD process includes operations 302 to 310. After operation 310, a determination is made, in operation 312, whether additional cycles are to be performed. If so, another cycle is performed. Any number of cycles can be performed to deposit a gate spacer layer, such as the second gate spacer layer 88 (FIGS. 3A and 3B), with a predetermined thickness.

If no additional cycles are needed, the ALD process can be concluded. The deposited film may be a SiOCN layer. As deposited, the film may include carbon in a range from about 13 at. % to about 13.5 at. %, for example, about 13.2 at. %. As deposited, the film may include nitrogen in a range from about 12 at. % to about 12.5 at. %, for example, about 12.2 at. %. As deposited, the film may include silicon in a range from about 20 at. % to about 30 at. %, for example, about 25.6 at. %. As deposited, the film may include oxygen in a range from about 45 at. % to about 55 at. %, for example, about 49.1 at. %.

In some embodiments, the ratio of the carbon concentration to the nitrogen concentration of the as deposited SiOCN layer is greater than one. In other words, the carbon concentration is substantially greater than the nitrogen concentration. As described above, the second gate spacer layer 88 has a carbon concentration in a range from about 1 at. % to about 10 at. %, a nitrogen concentration in a range from about 1 at. % to about 5 at, and a ratio of the carbon concentration to the nitrogen concentration in a range from about 2 to 1 to about 10 to 1. In order to for the second gate spacer layer 88 to have such composition, the as deposited SiOCN layer has a substantially greater carbon concentration than the nitrogen concentration. In some embodiments, the ratio of the silicon source precursor to the carbon and nitrogen source precursor to the oxygen source precursor ranges between about 1 to 1 to 8 and about 1 to 1 to 12, such as about 1 to 1 to 10, and the ratio of the duration of the silicon source precursor, the carbon and nitrogen source precursor, and the oxygen source precursor flowing into the ALD chamber ranges between about 1 to 1 to 1.1 and about 1 to 1 to 1.2. If the flow rates and flow duration of the precursors are outside of the above mentioned ranges, the carbon concentration may not be substantially greater than the nitrogen concentration. For example, the oxygen source precursor, such as oxygen gas, attacks both carbon and nitrogen and would replace more carbon if the flow rate and the flow time of the oxygen source precursor is outside of the above mentioned ranges. Thus, if the oxygen gas flow rate is greater than about 30 seconds, more carbon is replaced by the oxygen, leading to greater nitrogen concentration than carbon concentration. On the other hand, if the oxygen gas flow rate is less than about 20 seconds, not enough carbon and nitrogen atoms are replaced by the oxygen to form the SiOCN layer.

In operation 314, an anneal process is performed on the film formed by the ALD process to achieve a desired property. The anneal process is performed in an environment containing $H_2O$. The anneal process may be performed at a temperature ranging from about 300 degrees Celsius to about 600 degrees Celsius. When the anneal process is performed in the $H_2O$ environment, the carbon concentration of the as deposited SiOCN layer is affected substantially less than the nitrogen concentration. In other words, after the anneal process, the nitrogen concentration of the SiOCN layer decreased substantially more than the carbon concentration. As a result, the SiOCN layer has a ratio of the carbon concentration to the nitrogen concentration in a range from about 2 to 1 to about 10 to 1. If the anneal process is performed in an environment other than $H_2O$, such as $N_2$, $O_2$, or $H_2$, the carbon concentration and the nitrogen concentration are both decreased substantially, such that the resulting layer has a nitrogen concentration that is substantially greater than the carbon concentration. Therefore, because the as deposited SiOCN layer has the greater carbon concentration than the nitrogen concentration, and the anneal process is performed in an environment containing $H_2O$, the resulting SiOCN layer, or the second gate spacer layer 88 (FIGS. 3A and 3B), has a ratio of the carbon concentration to the nitrogen concentration in a range from about 2 to 1 to about 10 to 1. Lower nitrogen concentration leads to lower k value, which improves capacitance efficiency in the device.

Referring back to FIG. 8A, in some embodiments, the first gate spacer 86 includes SiOC having a first ratio of carbon concentration to nitrogen concentration, the second gate spacer 88 includes SiOCN having a second ratio of carbon concentration to nitrogen concentration, and the CESL 96 includes SiN or SiCN having a third ratio of carbon concentration to nitrogen concentration. The first ratio is substantially greater than the second ratio, which is substantially greater than the third ratio. In some embodiments, the first gate spacer 86 includes SiOCN having a first ratio of carbon concentration to nitrogen concentration, the second gate spacer 88 includes SiOCN having a second ratio of carbon concentration to nitrogen concentration, and the CESL 96 includes SiN or SiCN having a third ratio of carbon concentration to nitrogen concentration. The second ratio is substantially greater than the first ratio, which is substantially greater than the third ratio. The lower the nitrogen concentration, the lower the k value. The nitrogen concentration in some layers are higher relative to the carbon concentration in order to provide etch resistance in certain etch processes.

The present disclosure in various embodiments provides method for forming a semiconductor device structure. In some embodiments, the method includes forming a gate spacer layer, such as the second gate spacer layer 88, by flowing silicon source precursor, carbon and nitrogen source precursor, and oxygen source precursor into an ALD chamber at specific flow rates for specific amounts of time to form an as deposited SiOCN layer, followed by annealing the as deposited SiOCN layer in $H_2O$ environment to form a SiOCN layer having a density in a range from about 2.0 $g/cm^3$ to about 2.8 $g/cm^3$ and a k value less than about 4.1, such as from about 3.8 to about 4.0. Some embodiments may achieve advantages. For example, with the second gate spacer layer 88 having high-density and low k value, plasma resistance in certain etch processes and capacitance efficiency in the device are improved.

An embodiment is a method. The method includes forming a dielectric layer, which includes forming an as deposited layer using an atomic layer deposition process. The forming the as deposited layer using the atomic layer deposition process includes flowing a silicon source precursor into a process chamber at a first flow rate, flowing a carbon and nitrogen source precursor into the process chamber at a second flow rate, and flowing an oxygen source precursor into the process chamber at a third flow rate. A ratio of the first flow rate to the second flow rate to the third flow rate ranges between about one to one to eight and one to one to twelve, and the as deposited layer has a carbon concentration substantially greater than a nitrogen concentration. The method further includes annealing the as deposited layer in an environment including $H_2O$ to form the dielectric layer, and the dielectric layer has a ratio of carbon concentration to nitrogen concentration ranging from about two to one to about ten to one.

Another embodiment is a method. The method includes forming a fin over a substrate, forming a gate stack over the fin, and forming a first gate spacer layer over the gate stack. The forming the first gate spacer layer over the gate stack includes forming an as deposited layer using an atomic layer deposition process, which includes flowing a silicon source precursor into a process chamber for a first duration, flowing a carbon and nitrogen source precursor into the process chamber at for a second duration, and flowing an oxygen source precursor into the process chamber for a third duration. A ratio of the first duration to the second duration to the third duration ranges between about 1 to 1 to 1.1 and about 1 to 1 to 1.2, and the as deposited layer has a carbon concentration substantially greater than a nitrogen concentration. The forming the first gate spacer layer further includes annealing the as deposited layer in an environment including H2O to form the first gate spacer layer, and the first gate spacer layer has a carbon concentration substantially greater than a nitrogen concentration.

A further embodiment is a method. The method includes flowing a silicon source precursor into a process chamber at a first flow rate ranging from about 0.2 slm to about 0.8 slm for about 15 seconds to about 25 seconds, flowing a carbon and nitrogen source precursor into the process chamber at a second flow rate ranging from about 0.2 slm to about 0.8 slm for about 15 seconds to about 25 seconds, and flowing an oxygen source precursor into the process chamber at a third flow rate ranging from about 2 slm to about 8 slm for about 20 seconds to about 30 seconds. An as deposited layer is formed. The method further includes annealing the as deposited layer in an environment including $H_2O$ to form the dielectric layer, and the dielectric layer has a ratio of carbon concentration to nitrogen concentration ranging from about two to one to about ten to one.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A method, comprising:
forming a dielectric layer, comprising:
  forming an as deposited layer using an atomic layer deposition process, comprising:
    flowing a silicon source precursor into a process chamber at a first flow rate;
    flowing a carbon and nitrogen source precursor into the process chamber at a second flow rate; and
    flowing an oxygen source precursor into the process chamber at a third flow rate, wherein a ratio of the first flow rate to the second flow rate to the third flow rate ranges between about one to one to eight and one to one to twelve, and wherein the as deposited layer has a carbon concentration substantially greater than a nitrogen concentration; and
  annealing the as deposited layer in an environment including $H_2O$ to form the dielectric layer, wherein the dielectric layer has a ratio of carbon concentration to nitrogen concentration ranging from about two to one to about ten to one.

2. The method of claim 1, wherein the silicon source precursor comprises hexachlorodisilane.

3. The method of claim 2, wherein the carbon and nitrogen source precursor comprises triethylamine.

4. The method of claim 3, wherein the oxygen source precursor comprises oxygen gas.

5. The method of claim 1, wherein the atomic layer deposition process is performed in the process chamber at a temperature ranging from about 620 degrees Celsius to about 640 degrees Celsius.

6. The method of claim 1, wherein the silicon source precursor is flowed into the process chamber for a duration ranging from about 15 seconds to about 25 seconds.

7. The method of claim 6, wherein the carbon and nitrogen source precursor is flowed into the process chamber for a duration ranging from about 15 seconds to about 25 seconds.

8. The method of claim 7, wherein the oxygen source precursor is flowed into the process chamber for a duration ranging from about 20 seconds to about 30 seconds.

9. A method, comprising:
forming a fin over a substrate;
forming a gate stack over the fin; and
forming a first gate spacer layer over the gate stack, comprising:
forming an as deposited layer using an atomic layer deposition process, comprising:
flowing a silicon source precursor into a process chamber for a first duration;
flowing a carbon and nitrogen source precursor into the process chamber at for a second duration; and
flowing an oxygen source precursor into the process chamber for a third duration, wherein a ratio of the first duration to the second duration to the third duration ranges between about 1 to 1 to 1.1 and about 1 to 1 to 1.2, and wherein the as deposited layer has a carbon concentration substantially greater than a nitrogen concentration; and
annealing the as deposited layer in an environment including $H_2O$ to form the first gate spacer layer, wherein the first gate spacer layer has a carbon concentration substantially greater than a nitrogen concentration.

10. The method of claim 9, further comprising forming a second gate spacer layer on the gate stack, wherein the first gate spacer layer is formed on the second gate spacer layer.

11. The method of claim 10, further comprising anisotropically etching the first and second gate spacer layers.

12. The method of claim 11, further comprising forming a contact etch stop layer over the first gate spacer layer, the second gate spacer layer, and the gate stack.

13. The method of claim 12, wherein the first gate spacer layer comprises SiOCN, the second gate spacer layer comprises SiOC, and the contact etch stop layer comprises SiN or SiCN.

14. The method of claim 12, wherein the first gate spacer layer comprises SiOCN, the second gate spacer layer comprises SiOCN, and the contact etch stop layer comprises SiN or SiCN.

15. A method for forming a dielectric layer, comprising:
flowing a silicon source precursor into a process chamber at a first flow rate ranging from about 0.2 slm to about 0.8 slm for about 15 seconds to about 25 seconds;
flowing a carbon and nitrogen source precursor into the process chamber at a second flow rate ranging from about 0.2 slm to about 0.8 slm for about 15 seconds to about 25 seconds; and
flowing an oxygen source precursor into the process chamber at a third flow rate ranging from about 2 slm to about 8 slm for about 20 seconds to about 30 seconds, wherein an as deposited layer is formed; and
annealing the as deposited layer in an environment including $H_2O$ to form the dielectric layer, wherein the dielectric layer has a ratio of carbon concentration to nitrogen concentration ranging from about two to one to about ten to one.

16. The method of claim 15, wherein the silicon source precursor comprises hexachlorodisilane.

17. The method of claim 16, wherein the carbon and nitrogen source precursor comprises triethylamine.

18. The method of claim 17, wherein the oxygen source precursor comprises oxygen gas.

19. The method of claim 18, wherein the dielectric layer comprises a SiOCN layer.

20. The method of claim 16, wherein the carbon concentration of the dielectric layer ranges from about 1 atomic percent to about 10 atomic percent, and the nitrogen concentration of the dielectric layer ranges from about 1 atomic percent to about 5 atomic percent.

* * * * *